May 30, 1961 J. J. EACHUS 2,986,652

ELECTRICAL SIGNAL GATING APPARATUS

Filed Oct. 9, 1956

INVENTOR.
JOSEPH J. EACHUS
BY Henry L. Hanson
ATTORNEY

1

2,986,652

ELECTRICAL SIGNAL GATING APPARATUS

Joseph J. Eachus, Cambridge, Mass., assignor, by mesne assignments, to Minneapolis-Honeywell Regulator Company, a corporation of Delaware Filed Oct. 9, 1956, Ser. No. 614,839

9 Claims. (Cl. 307—88.5)

A general object of the present invention is to provide a new and improved electrical signal control circuit particularly adapted for the switching and gating of control signals. More specifically, the present invention is concerned with a new and improved signal control circuit which is characterized by its signal gating capabilities and by its utilizing a minimum of electrical components to achieve the desired operating characteristics.

Control circuits for electrical signals of various types are receiving wide application in many fields of communication, computation, and the like. The signal utilization circuitry has had a speed factor imposed thereon requiring that electronic means be adapted for the switching and control of signals being used. For this purpose, numerous types of electronic circuits have been devised for switching and gating the electrical signals. One of the principal difficulties arising from the use of existing gating circuitry is the complexity and large number of components required in the associated circuitry.

The present invention achieves a high degree of signal control while minimizing the circuit component requirements as well as a number of distinct power supplies required by the utilization of a unique control circuit employing two asymmetrically conducting devices, such as diodes, having different thresholds of conduction. As is known, electronic devices of the vacuum and semi-conductor type require certain potentials thereacross before there will be any current flow through the device. Thus, a semi-conductor diode of the germanium type has a conducting threshold whose value is less than the conducting threshold value of a silicon type of diode. This is due to the difference in energy levels in silicon and germanium crystals. This difference is disclosed in an article by Frank Herman in the Proceedings of the I.R.E., December 1955, pages 1703–1732.

It is accordingly a more specific object of the present invention to provide a new and improved signal control circuit incorporating electronic devices having different thresholds of conduction.

Another more specific object of the present invention is to provide a new and improved signal control circuit incorporating semi-conductor asymmetrically conducting devices having different thresholds of conduction where one of said devices is adapted to be rendered conductive when the other is nonconductive.

When diodes, particularly of the semi-conductor type, are used in signal control circuitry transistors may be conveniently used in the circuit combination as switching and control elements. The ease with which this may be accomplished is due to the fact that the potential drops across and the current flows through the diodes and transistors may readily be selected to be in the same range and consequently the number of control circuit components required may be minimized. By minimizing the control circuit components, the number of components present which tend to introduce noise and other unwanted signals in the circuit is correspondingly min-

2 imized. The end result is a circuit having extremely reliable signal control characteristics with a high signal to noise ratio.

Further, the present invention is concerned with a new and improved signal control circuit utilizing diodes in combination with transistors where the transistors selectively control the signal potentials in the diode circuit within the region of the conducting thresholds of the diodes.

Still another more specific object of the present invention is to provide a diode gating circuit wherein a pair of transistors are adapted to be positioned in a current flow circuit for a pair of gating diodes with one of the diodes acting as a threshold potential control element and the other transistor acting as an output element.

A still further more specific object is to provide a new and improved logical control circuit including diodes and transistors where the logical functions may be accomplished with a minimum of circuit components.

The various features of novelty which characterize the invention are pointed out with particularity in the claims annexed to and forming a part of the present specification. For a better understanding of the invention, its advantages, and specific objects attained with its use, reference should be had to the accompanying drawings and descriptive matter in which there is illustrated and described a preferred embodiment of the invention.

Figure 1:
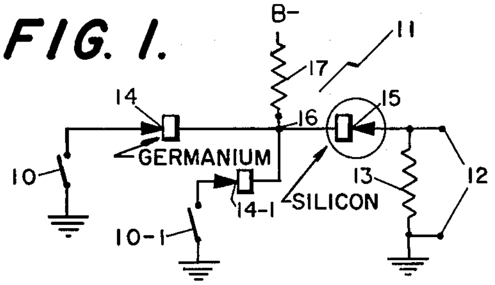
Figure 1 is a diagrammatic showing of a simple diode gating circuit illustrating the principles of the present invention.

Referring first to Figure 1, the numeral 10 represents an input control element in the form of a switch. The control element 10 is connected to control the signal current flow in a gating circuit and this gating circuit is indicated generally by the numeral 11. The gate circuit 11 in turn controls the presence or absence of a signal on a pair of output terminals 12 which are connected across a suitable impedance 13. The gating circuit 11 comprises a pair of diodes 14 and 15 connected so that their cathode elements are connected together to a junction line 16. Connected to the junction 16 is a resistor 17 whose opposite end is connected to a negative potential source designated B minus.

In the gating circuit 11, the diode 14 is selected to have a conducting threshold potential which is less than the conducting threshold potential of the diode 15. For example, the diode 15, if of the silicon semi-conductor type, may have a conducting threshold potential of approximately 500 millivolts. The conducting threshold potential for the diode 14 will be less than half of that of the diode 15 or less than 250 millivolts. If vacuum diodes or other types of semi-conductor diodes are used, the circuit will function in the desired manner so long as the diode 14 has a conducting threshold potential less than that of the diode 15.

The conducting threshold characteristic of any one of the circuit diodes may be defined as that quality or trait which causes the diode to become conductive at a particular point as the voltage thereacross is increased. Thus, the conducting threshold characteristic of a silicon diode and a germanium diode are different by a factor of approximately two.

In considering the operation of the circuit shown in Figure 1, when input switch 10 is closed, it is desired that there be no output signal on the output terminals 12. With the switch 10 closed, there will be a current flow that may be traced from the ground terminal through the switch 10 to the diode 14, and resistor 17 to the B minus supply terminal. The potential drop between the junction point 16 and the ground terminal will be due to the internal resistance of the switch 10 and the diode 14. If a germanium diode is used, the potential drop on the diode 14 will be approximately 250 millivolts. This will mean that the potential at the junction point 16 will be 250 millivolts. With a potential of 250 millivolts at junction 16, the potential across the diode 14 will be less than the threshold potential of the diode 15 so that the diode will appear as a very high resistance and there will be substantially no current flowing from the ground terminal through the resistor 13 and the diode 15.

In order to produce an output signal on the output terminals 12, the switch 10 is opened so that now the potential at the junction point 16 will increase in a negative direction toward the potential on the B minus terminal. As soon as the potential at the junction 16 increases above the 500 millivolt threshold potential of diode 15, the diode 15 will conduct by a circuit that may be traced from the ground terminal through the resistor 13, the diode 15, and the resistor 17 to the B minus terminal. This produces a voltage drop across resistor 13 and thereby an output potential on the output terminal 12.

Additional inputs may be used to control the signal on the output terminals 12. For example, an additional switching means 10–1 and diode 14–1 may be connected to the junction 16 so that if the switch 10–1 is closed, the potential at the junction 16 will be decreased below the threshold potential of the diode 15 and there will be no output signal. Thus, a number of signals may be fed into the junction 16 by way of input diodes and any one of these diodes may be used to selectively control the output signal so long as the diode has a threshold potential less than the threshold potential diode 15.

Figure 2:
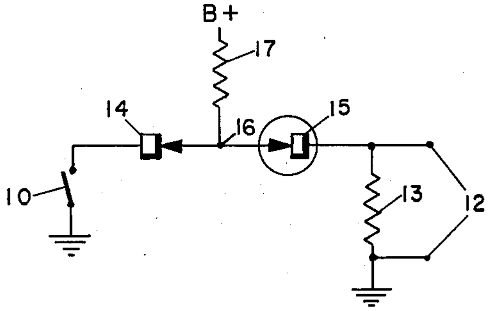
Figure 2 is a modified circuit with a pair of diodes connected into a gating configuration.

Figure 2 is basically the same as Figure 1 except that the polarities of the circuits have been reversed so that the circuit is working above ground by reason of the connection to the B plus terminal. In this case, the diodes 14 and 15 have been reversed in their connection in the circuit.

In Figure 2, when the switch 10 is closed the current will flow from the B plus terminal through resistor 17 and diode 14 to the switch 10 to the ground terminal. With the diode 14 having a threshold potential less than that of a diode 15, the voltage drop across the diode 14 will drop the potential 16 below that required for current to flow through the diode 15. Consequently, there will be no output potential across the resistor 15 at the output terminals 12. When the switch 10 is open, the potential at the junction 16 will reduce to a point where the diode 15 conducts. There will be a potential drop across the resistor 13 and thereby a signal on the output terminals 12. As with Figure 1, a number of input signals may be connected by way of suitable diodes poled in the same manner as shown in the figure to the junction 16 so that a plurality of different signals may be used to control the output signal on the terminals 12.

Figure 3:
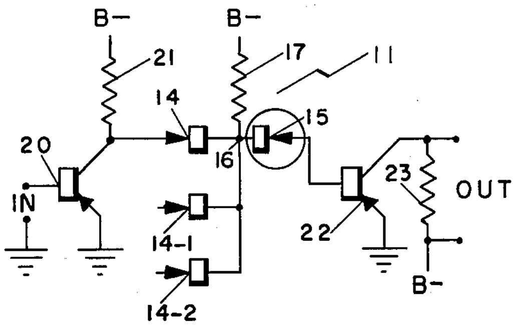
Figure 3 shows a transistor-diode logical circuit incorporating the gating circuit of the present invention.

Figure 3 shows the principles of the present invention applied to a signal control circuit incorporating a transistor as the input switching element and a further transistor as the output control element with the diode signal control circuit of Figure 1 incorporated between the two transistors.

More specifically, the circuit in Figure 3 includes an input transistor 20 having the usual base, emitter, and collector electrodes. Connected to the collector electrode is a load resistor 21, the other end of which is connected to the B minus power supply terminal. Connected in the output circuit is the transistor 22 also having the usual base, emitter, and collector electrodes. Connected to the collector electrode is an output load resistor 23 which leads to a B minus power supply terminal.

In considering the operation of Figure 3, when there is an input potential applied to the base of the transistor 20, the transistor 20 will conduct and a current flow circuit may be traced from the ground terminal through the emitter electrode, collector electrode, and resistor 21 to the B minus power supply terminal. The voltage drop between the emitter and the collector of the transistor 20 will be such that it will appear as a closed switch similar to the switch 10 and will have a very small voltage thereacross, approximately 100 millivolts, for example. With a low potential drop across the emitter-collector circuit to the transistor 20, there will also be a current flow through the diode 14 by a circuit that may be traced from the ground terminal through the emitter-collector circuit of the transistor 20, the diode 14 and resistor 17 to the B minus power supply terminal of the signal control circuit 11. If a germanium diode is used for the diode 14, the potential drop across the emitter-collector circuit and the potential drop across the diode 14 will still be less than the threshold potential of the diode 15 so that the potential at junction 16 will be sufficiently low to prevent any current flow through the diode 15. With the diode 15 having no current flowing therethrough, the transistor 22 will be nonconducting and there will be no potential drop across the load resistor 23.

When the input signal is removed from the input transistor 20, the potential across the transistor 20 will increase to the point where the junction 15 will rise above the conducting threshold potential of the diode 15. As soon as the threshold potential of the diode 15 has been exceeded, a current will begin to flow from the ground electrode through the transistor 22 emitter-base circuit, the diode 15 and resistor 17 to the B minus potential source. The current flowing in the base-emitter circuit of the transistor 22 will cause the transistor 22 to become conductive so that a current will flow through the emitter-collector circuit of the transistor and the resistor 23 to the negative power supply terminal. The current flowing through the resistor 23 will produce a voltage drop thereacross which may be utilized as an output signal from the circuit.

It will be apparent, as in Figure 1, a number of different signals from diodes such as diodes 14–1 and 14–2 may all be connected to the junction 16 in the manner shown with suitable transistors as the switching means. The net result is that any one of the diodes and the associated switching means may be used to control the conduction and nonconduction of the transistor 22.

Figure 4:
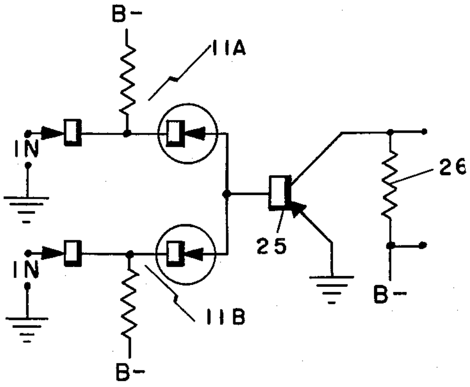
Figure 4 shows a further form of diode-transistor logical circuit incorporating the principles of the present invention.

Figure 4 shows another modification wherein a signal control circuit of the type shown in Figure 1 is adapted for use with an output control transistor 25 having a load resistor 26 connected in the emitter-collector circuit. In the circuit of Figure 4, two signal control circuits of the type shown in Figure 1 are connected to the output control transistor 25 and these two circuits are identified by the numerals 11A and 11B. The components incorporated in these circuits 11A and 11B utilize the characteristics set forth in the circuit shown in Figure 1.

In the operation of the circuit in Fig. 4 if either or both of the inputs of the control circuits 11A and 11B are open circuited, or contain a high impedance, there will be a current flow through the emitter-base circuit of the transistor 25 to one or both of the B minus terminals connected to the control circuits 11A and 11B depending upon whether one or both of said circuits have their inputs open. When the current flows through the transistor 25 emitter-base circuit, there will also be a current flow in the emitter-collector circuit and thereby the output resistor 26 so that there will be an output potential indicative of the input circuit conditions on the control circuits 11A and 11B. It will be apparent that both the circuits 11A and 11B may incorporate additional inputs in addition to the single inputs shown in the manner set forth in Figure 1 and Figure 3.

Figure 5:
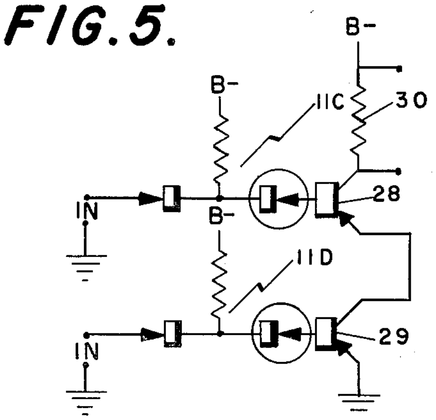
Figure 5 shows still another form of diode-transistor logical circuit incorporating the principles of the present invention.

Figure 5 shows a control circuit where two input control signals must be present at the same time in order for there to be produced an output control signal. This circuit incorporates two signal control circuits 11C and 11D both of which may be of the type shown in Figure 1. The control circuit 11C is connected to the base of the transistor 28 while the control circuit 11D is connected to the base of the transistor 29. In this circuit, the transistors 29 and 28 have their emitter-collector circuits connected in series between the ground terminal and a negative power supply terminal by way of a resistor 30 which may be used as the output resistor for the circuit.

If there is a shorting signal present on the inputs of either of the control circuits 11C or 11D, the control circuit will not condition the associated transistor for current transmission in the emitter-collector circuit thereof so that there will be no current flowing in the load resistor 30. However, if both of the input circuits for the control circuits 11C and 11D are open and current can flow in the emitter-base circuit of both transistors 28 and 29, the current will flow through the load resistor 30 to produce a voltage drop thereacross.

It will be readily apparent from the foregoing discussion that the principles set forth are applicable to steady state signal switching or pulse signal switching so that the circuit is adapted for use in any type of electronic circuitry requiring some logical control function whether it be in the communication field or the field of computers.

While, in accordance with the provisions of the statutes, there has been illustrated and described the best form of the invention known, it will be apparent to those skilled in the art that changes may be made in the form of the apparatus disclosed without departing from the spirit of the invention as set forth in the appended claims, and that in some cases, certain features of the invention may be used to advantage without a corresponding use of other features.

Having now described the invention, what is claimed as new and for which it is desired to secure by Letters Patent is:

1. A control circuit comprising, in combination, a transistor having base, emitter and collector electrodes, an emitter-base current control circuit comprising a first diode connected to pass current in the same direction as the current in the emitter-base circuit, said diode having a conducting threshold in a preselected direction which is of a predetermined value, a potential source connected to said diode, and swtich means connected to selectively control the potential of said source on said diode to be above and below said predetermined value of conducting threshold, said switch means comprising a second diode having a conducting threshold in a preselected direction which is of a value less by a factor of one-half than that of said first named diode, and a second transistor connected to control the potential drop across said second diode and thereby the potential on said first named diode so that said first named diode may be rendered selectively conducting or nonconducting as a direct function of the potential drop across said second diode.

2. A signal control circuit comprising a first signal gating circuit; a second signal gating circuit; said first and second signal gating circuits each comprising a pair of diode means of different conductivity types connected in series between a pair of input terminals and a pair of output terminals, said diodes having thresholds of conduction which are different in magnitude by a factor of at least two and each diode has a electrode connected to an electrode of the other at a common junction point and the diode means having the highest threshold of conduction is connected to one of said output terminals, a potential source having an output potential whose magnitude is greater than the threshold of conduction of either of said diodes, an impedance, means including said impedance connecting said potential source to said junction point so that a current flow through said diodes may occur in the same relative direction when referenced to said potential source, and an impedance switch connected in series with said input terminals; and a transistor having the output terminals of said first and second gating circuits connected to the input thereof.

3. In combination, a first diode means of a first type having a conducting threshold of a first value, a second diode means of a second type having a conducting threshold of a second value at least twice as great as said first value, means connecting a like electrode of each of said diode means to a first junction point, a second junction point, a potential source connected between said first and second junction points and having a potential value greater than said second value, a load circuit connected in a series circuit with said second diode means between said first and second junction points, and variable impedance switching means connected in a series circuit with said first diode means between said first and second junction points to switch said first diode means between a conducting and nonconducting state, said first diode means having a potential drop thereacross when conducting, which potential drop changes the potential at said first junction point below the conducting threshold of said second diode means.

4. In combination, a first diode means of a first type having a conducting threshold of a first value, a second diode means of a second type having a conducting threshold of a second value at least twice as great as said first value, means connecting a like electrode of each of said diode means to a first junction point, a second junction point, a potential source connected between said first and second junction points and having a potential value greater than said second value, a load circuit connected in a series circuit with said second diode means between said first and second junction points, and a transistor switch means being adapted to operate as a variable impedance switch means and connected in a series circuit with said first diode means between said first and second junction points to switch said first diode means between a conducting and nonconducting state, said first diode means having a potential drop thereacross when conducting, which potential drop changes the potential at said first junction point below the conducting threshold of said second diode means.

5. In combination, a first diode means of a first type having a conducting threshold of a first value, a second diode means of a second type having a conducting threshold of a second value at least twice as great as said first value, means connecting a like electrode of each of said diode means to a common junction point, a potential source connected to said junction point and having a potential value greater than said second value, circuit means connecting the other like electrodes of said diode means to a common reference potential point, means connected to said first diode means to switch said first diode means between a conducting and nonconducting state, said first diode means having a potential drop thereacross when conducting which effects a corresponding change in the potential at said junction so that the potential thereon is below the conducting threshold of said second diode means, and means connecting said second diode means to an output circuit.

6. In combination, a germanium diode means having a conducting threshold of a first value, a silicon diode means having a conducting threshold of a second value at least twice as great as said first value, means connecting a like electrode of each of said diode means to a common junction point, a potential source connected to said junction point and having a potential value greater than said second value, circuit means connecting the other like electrodes of said diode means to a common reference potential point, and means connected to said germanium diode means to switch said germanium diode means between a conducting and a nonconducting state, said germanium diode means having a potential drop thereacross when conducting which effects a corresponding change in the potential at said junction so that the potential thereon is below the conducting threshold of said silicon diode means.

7. In combination, a first diode means of a first type having a conducting threshold of a first value, a second diode means of a second type having a conducting threshold of a second value at least twice as great as said first value, means connecting a like electrode of each of said diode means to a common junction point, a potential source connected to said junction point and having a potential value greater than said second value, a variable impedance means connected in series with said first diode means to switch said first diode means between a conducting and nonconducting state, said first diode means having a potential drop thereacross when conducting which causes the potential at said junction to drop a corresponding amount which is below the conducting threshold of said second diode means, and a load circuit connected to said second diode means.

8. A signal gating circuit comprising a pair of diode means of different conductivity types connected in series between a pair of input terminals and a pair of output terminals, said diodes having thresholds of conduction which are different in magnitude by a factor of at least two and each diode has an electrode connected to an electrode of the other at a common junction point and the diode means having the highest threshold of conduction is connected to one of said output terminals, a potential source having an output potential whose magnitude is greater than the threshold of conduction of either of said diodes, an impedance, means including said impedance directly connecting said potential source to said junction point so that a current flow through said diodes by way of said junction point may occur in the same relative direction when referenced to said potential source, an impedance switch connected in series with said input terminals, and a load circuit connected to said output terminals.

9. A signal control circuit comprising a first signal gate, a second signal gate, said first and second signal gates each comprising a pair of diode means of different conductivity types connected in series between a pair of input terminals and a pair of output terminals, said diodes having thresholds of conduction which are different in magnitude by a factor of at least two and each diode has an electrode connected to an electrode of the other at a common junction point and the diode means having the highest threshold of conduction is connected to one of said output terminals, a potential source having an output potential whose magnitude is greater than the threshold of conduction of either of said diodes, an impedance, means including said impedance connecting said potential source to said junction point so that a current flow through said diodes may occur in the same relative direction when referenced to said potential source, an impedance switch connected in series with said input terminals, a first transistor having the output terminal of said first gate connected to the input thereof, a second transistor having the output terminals of said second transistor connected to the input thereof, and means connecting the output current flow paths of said transistors in series.

References Cited in the file of this patent

UNITED STATES PATENTS

| | | |
|---|---|---|
| 2,616,960 | Dell et al. | Nov. 4, 1952 |
| 2,627,039 | MacWilliams | Jan. 27, 1953 |
| 2,658,142 | St. John | Nov. 3, 1953 |
| 2,676,271 | Baldwin | Apr. 20, 1954 |
| 2,777,956 | Kretzmer | Jan. 15, 1957 |
| 2,792,506 | Torrey | May 14, 1957 |
| 2,843,837 | Thaler et al. | July 15, 1958 |
| 2,854,651 | Kircher | Sept. 30, 1958 |

OTHER REFERENCES

Keister et al.: "The Design of Switching Circuits" book printed by D. Van Nostrand Co., Inc., Princeton, New Jersey, copyright in 1951, page 323.